(12) United States Patent
Anderson et al.

(10) Patent No.: US 9,257,427 B2
(45) Date of Patent: Feb. 9, 2016

(54) MERGED TAPERED FINFET

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 266 days.

(21) Appl. No.: 13/941,813

(22) Filed: Jul. 15, 2013

(65) Prior Publication Data
US 2015/0014774 A1     Jan. 15, 2015

(51) Int. Cl.

| | |
|---|---|
| H01L 29/94 | (2006.01) |
| H01L 27/092 | (2006.01) |
| H01L 27/12 | (2006.01) |
| H01L 29/66 | (2006.01) |
| H01L 29/78 | (2006.01) |
| H01L 21/84 | (2006.01) |
| H01L 21/8238 | (2006.01) |

(52) U.S. Cl.
CPC .... H01L 27/0924 (2013.01); H01L 21/823821 (2013.01); H01L 21/845 (2013.01); H01L 27/1211 (2013.01); H01L 29/66795 (2013.01); H01L 29/785 (2013.01); *H01L 2029/7858* (2013.01)

(58) Field of Classification Search
CPC ............ H01L 29/785; H01L 29/66795; H01L 27/1211; H01L 21/845; H01L 2029/7858
USPC ......................................... 257/401, 328, 331
See application file for complete search history.

(56) References Cited

U.S. PATENT DOCUMENTS

| | | | |
|---|---|---|---|
| 7,456,471 B2 | 11/2008 | Anderson et al. | |
| 7,470,570 B2 | 12/2008 | Beintner et al. | |
| 7,517,806 B2 | 4/2009 | Bryant et al. | |
| 7,687,859 B2 | 3/2010 | Russ et al. | |
| 7,692,254 B2 | 4/2010 | Anderson et al. | |
| 8,043,920 B2 | 10/2011 | Chan et al. | |
| 2003/0178670 A1 | 9/2003 | Fried et al. | |
| 2006/0043616 A1 | 3/2006 | Anderson et al. | |
| 2006/0216880 A1 | 9/2006 | Suto | |
| 2007/0287256 A1 | 12/2007 | Chang et al. | |
| 2008/0283925 A1 | 11/2008 | Berthold et al. | |
| 2009/0050975 A1 | 2/2009 | Bryant et al. | |
| 2012/0091538 A1 | 4/2012 | Lin et al. | |
| 2012/0126326 A1 | 5/2012 | Wang et al. | |

*Primary Examiner* — Howard Weiss
*Assistant Examiner* — Tifney Skyles
(74) *Attorney, Agent, or Firm* — Gibb & Riley, LLC; Michael J. LeStrange, Esq.

(57) ABSTRACT

According to a structure herein, parallel fins comprise channel regions and source and drain regions. Parallel gate conductors are over and intersecting the channel regions of the fins. Electrical insulator material surrounds sides of the gate conductors. Each of the fins has a main fin body and wider regions extending from the main fin body between the electrical insulator material surrounding the sides of the gate conductors. The wider regions comprise a first wider region extending a first width from the main fin body and a second wider region extending a second width from the main fin body. The material of the second wider region is continuous between adjacent fins.

18 Claims, 14 Drawing Sheets

US 9,257,427 B2

MERGED TAPERED FINFET

BACKGROUND

The present disclosure relates generally to integrated circuit device design, and more specifically, to a layout for a field effect transistor (FET) device with a multiple fins that are tapered and have merged regions.

Multi-fingered field effect transistors (FETs) are widely used in various integrated circuit applications. Multi-finger transistor layouts are widely used in CMOS circuit designs. Compared with single-finger transistor layout, its main features include effectiveness in reducing circuit physical size, reducing gate resistance (and thus improve the RF performance of the FET), and improving device matching. One FinFET architecture employs the 'merging' of source/drain regions of fins to arrive at planar-like contact rules/processes. This merged region adds to gate-to-drain (and source) capacitance, which increases circuit delay and power, both elements highly undesirable. This disclosure teaches a structure and method to reduce this deleterious capacitance in a merged Fin architecture.

SUMMARY

According to a structure herein, parallel fins comprise channel regions and source and drain regions. Parallel gate conductors are over and intersecting the channel regions of the fins. Electrical insulator material surrounds sides of the gate conductors. Each of the fins has a main fin body and wider regions extending from the main fin body between the electrical insulator material surrounding the sides of the gate conductors. The wider regions comprise a first wider region extending a first width from the main fin body and a second wider region extending a second width from the main fin body. The material of the second wider region is continuous between adjacent fins.

According to a complementary metal oxide semiconductor (CMOS) device herein, parallel fins comprise channel regions and source and drain regions. Parallel gate conductors are over and intersecting the channel regions of the fins. Electrical insulator material surrounds the sides of the gate conductors. Each of the fins has a main fin body and wider regions extending from the main fin body between the electrical insulator material surrounding the sides of the gate conductors. The wider regions comprise a first wider region extending a first width from the main fin body. The first wider region comprises a first material. The wider regions comprise a second wider region extending a second width from the main fin body. The second wider region comprises a first portion comprising a second material and a second portion comprising a third material. The second material and the third material have different impurity qualities. The material of the second wider region is continuous between adjacent fins.

According to a method of fabricating a field effect transistor (FET) herein, parallel fins are formed on a top surface of a substrate. Gate structures are formed across the parallel fins on the top surface of the substrate. A spacer is formed on sidewalls of the gate structure. Sections of silicon are selectively grown on first exposed regions of the parallel fins. A gap is formed between the sections of silicon and the spacer, exposing second exposed regions of the parallel fins. A first material is selectively grown on a portion of the second exposed regions of the parallel fins and a portion of the sections of silicon. The first material is covered with a dielectric material. A second material is selectively grown on a portion of remaining portions of the second exposed regions of the parallel fins and of the sections of silicon.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
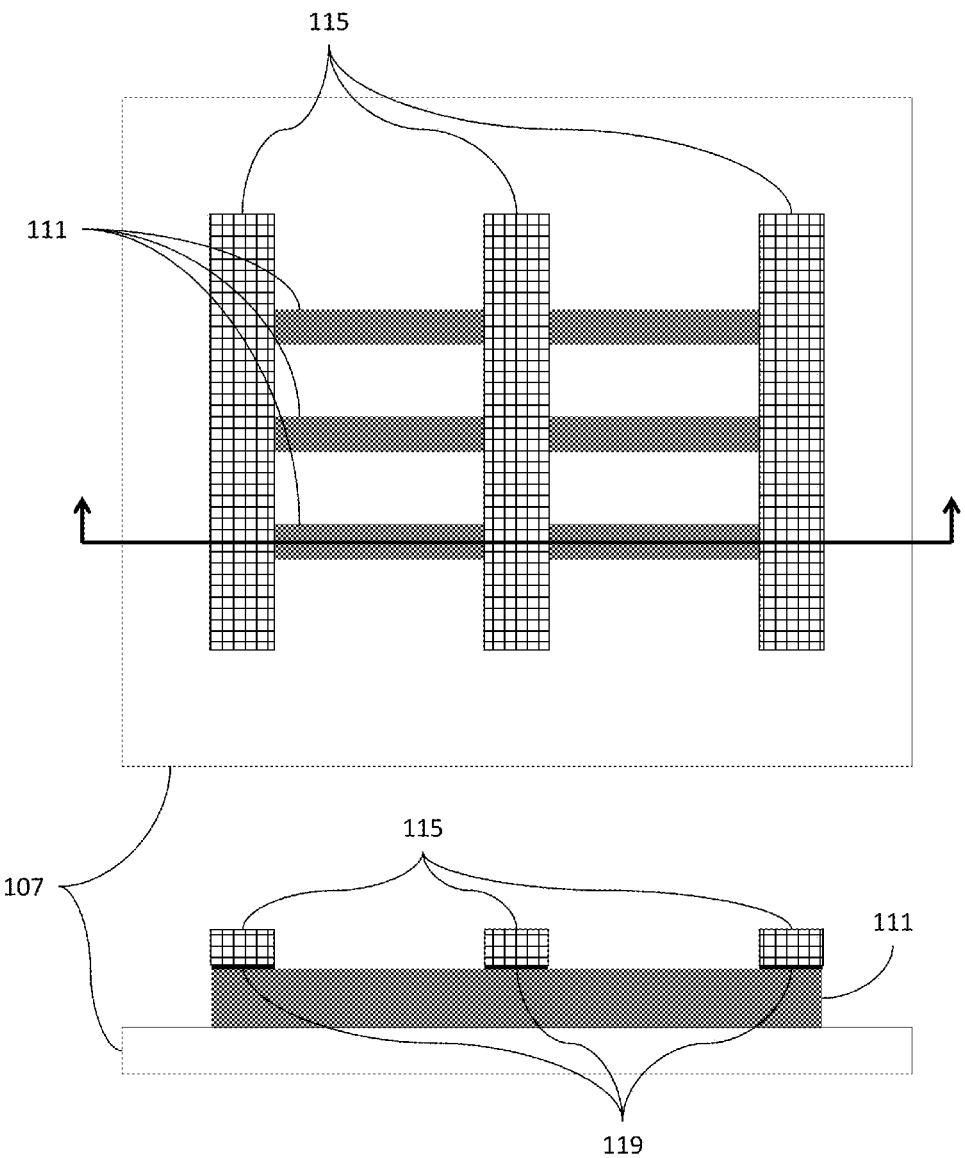
FIG. 1 is a schematic diagram of a semiconductor structure illustrating various aspects of devices and methods herein.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

FIG. 1 shows a substrate, indicated generally as 107, having a plurality of fins 111 thereon. The fins of the plurality of fins 111 are in parallel with each other. A plurality of gate structures 115 intersects the plurality of fins 111. The gate structures 115 are separated from the plurality of fins 111 by a thin insulator layer 119.

Figure 1A:
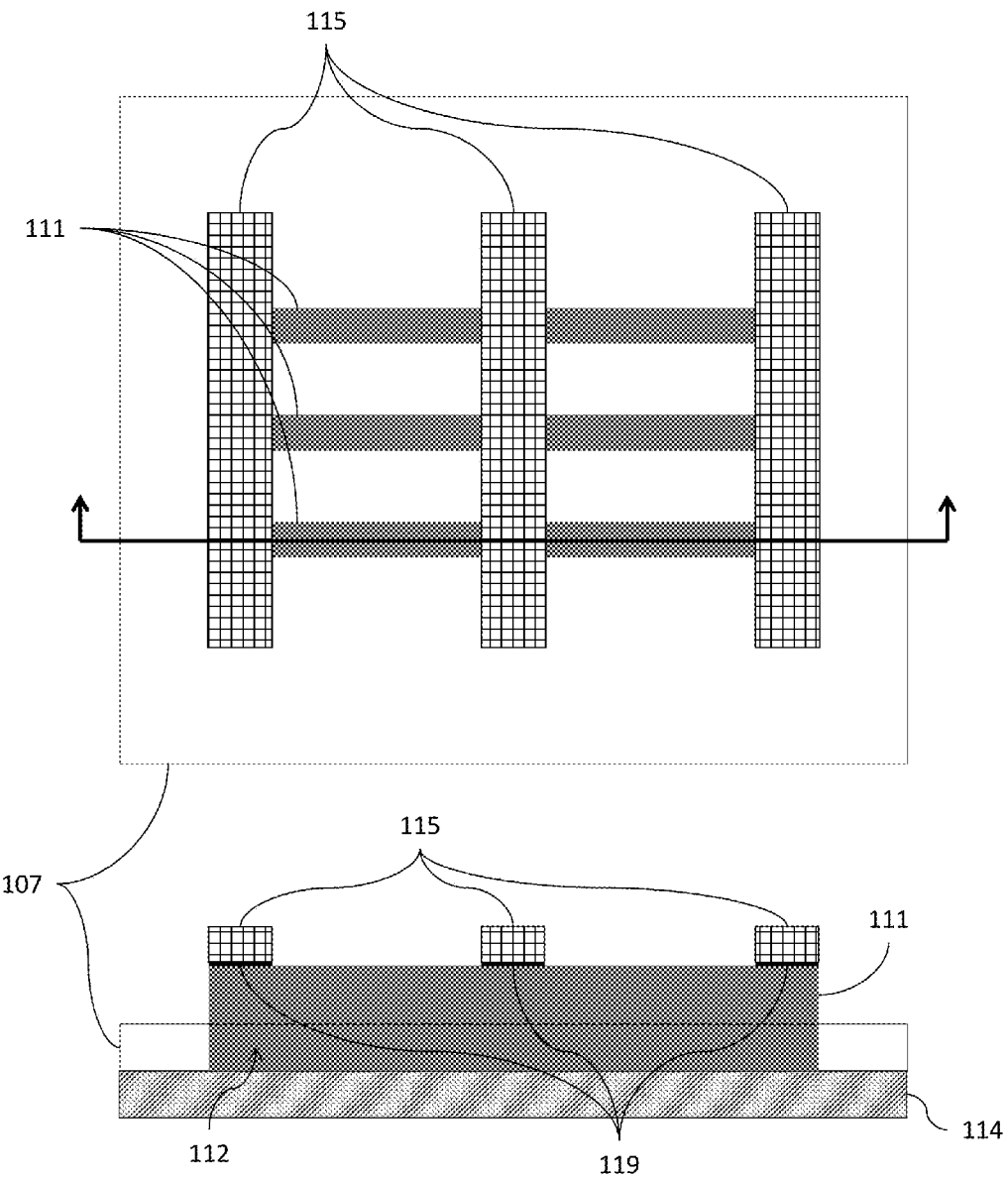
FIG. 1a is a schematic diagram of the semiconductor structure of FIG. 1, illustrating another feature according to devices and methods herein.

In some examples, the fins 111 may extend below the device region, as a sub-fin 112, such as shown in FIG. 1a. The sub-fin 112 can connect to a semiconductor substrate 114. The region of the sub-fin 112 is not part of the active device, but electrically isolates the device fin from the substrate 107 by means of well doping or other techniques, such as bandgap engineering.

Figure 2:
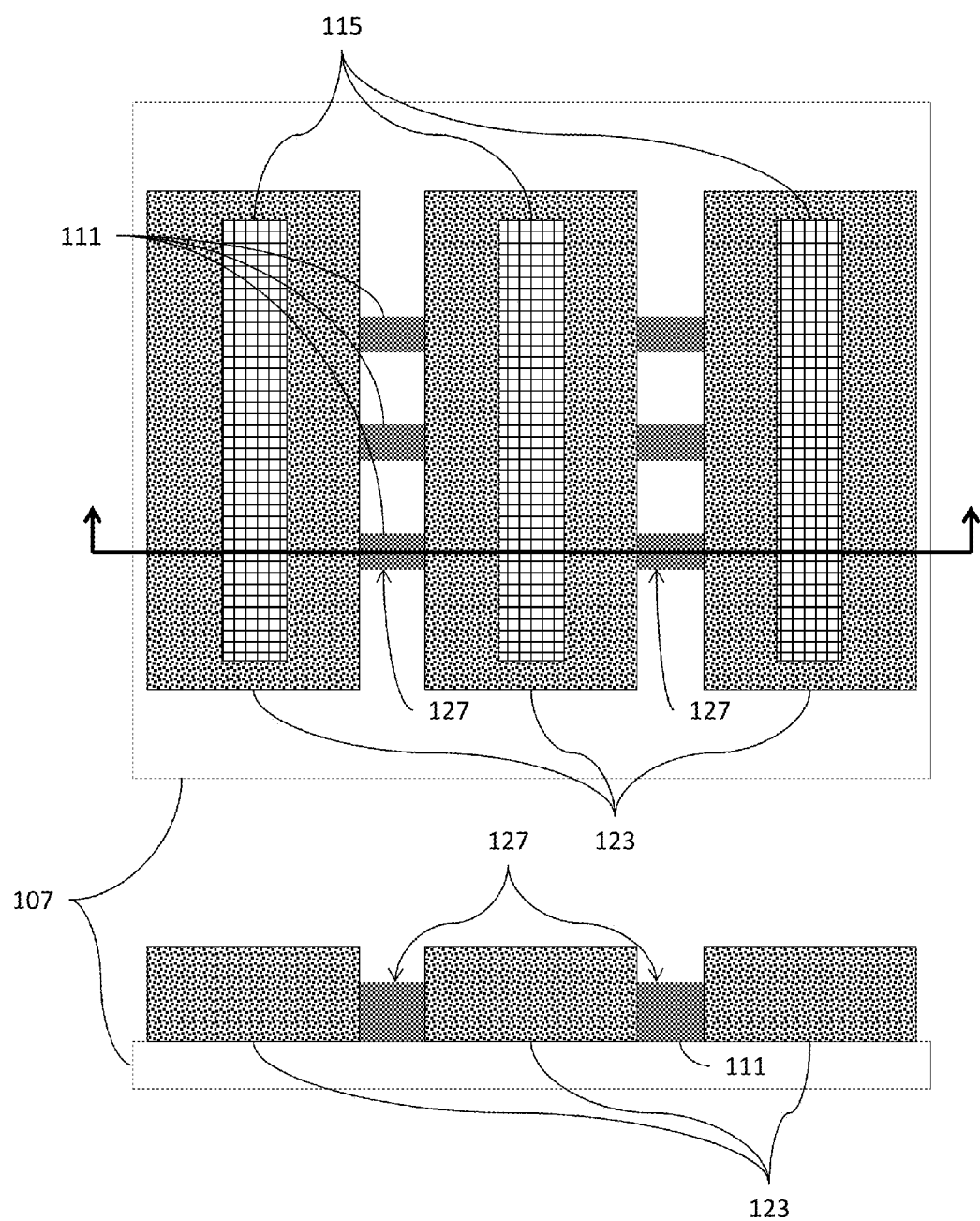
FIG. 2 is a schematic diagram of a semiconductor structure illustrating various aspects of devices and methods herein.
Figure 3:
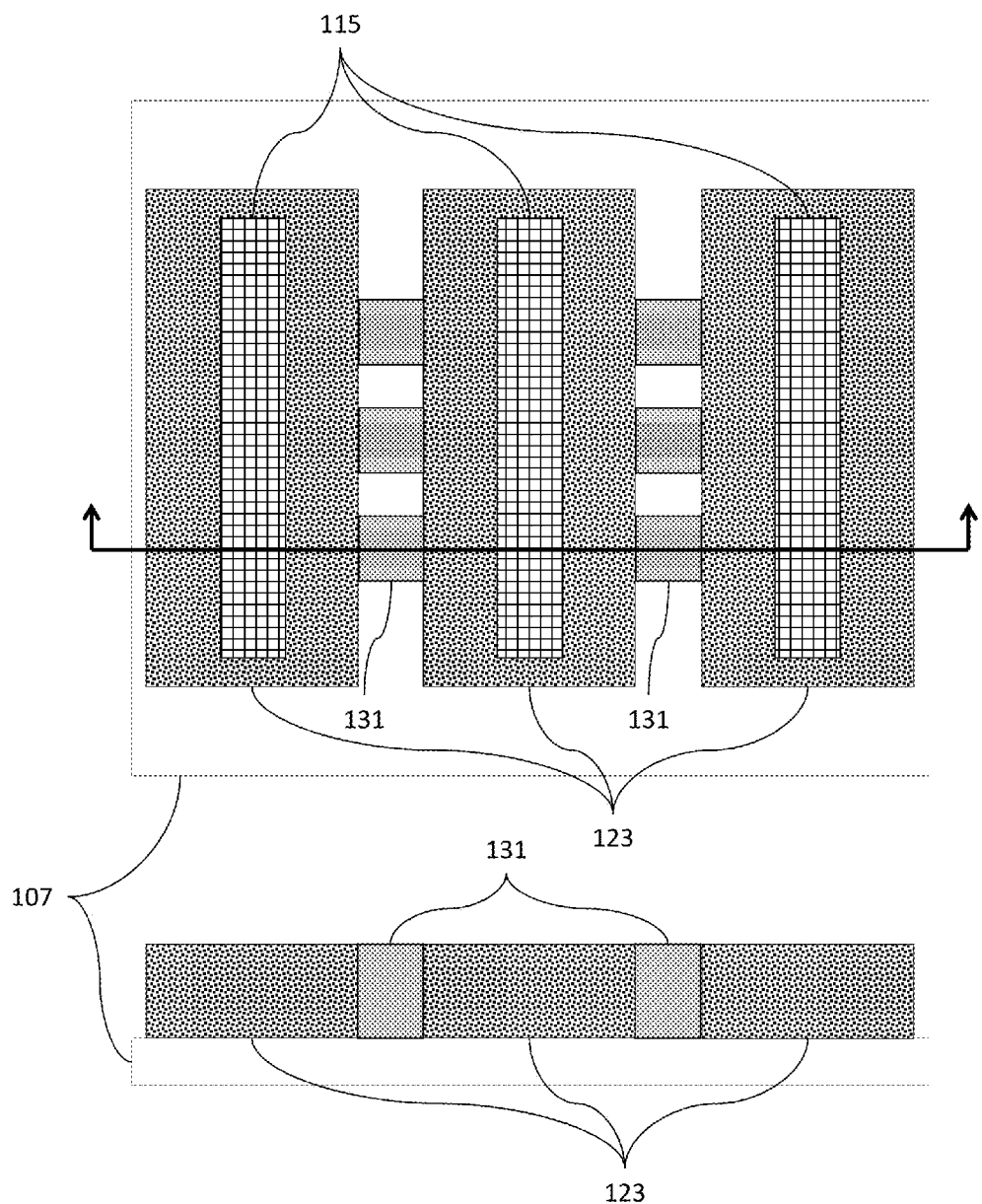
FIG. 3 is a schematic diagram of a semiconductor structure illustrating various aspects of devices and methods herein.

In FIG. 2, a spacer 123 has been formed around each of the gate structures 115 leaving first exposed regions 127 of the fins. The spacer 123 may comprise an electrical insulator material, such as oxide, nitride, or other dielectric. Additionally, the spacer 123 can be formed by any appropriate method, such as chemical-vapor deposition (CVD), electrochemical deposition (ECD), and the like. FIG. 3 shows sections of silicon 131 on the first exposed regions 127 of the fins. According to devices and methods herein, the sections of silicon 131 may be selectively grown in the first exposed regions 127 of the fins using an epitaxial process. Other appropriate methods to form the sections of silicon 131 may be used.

Figure 4:
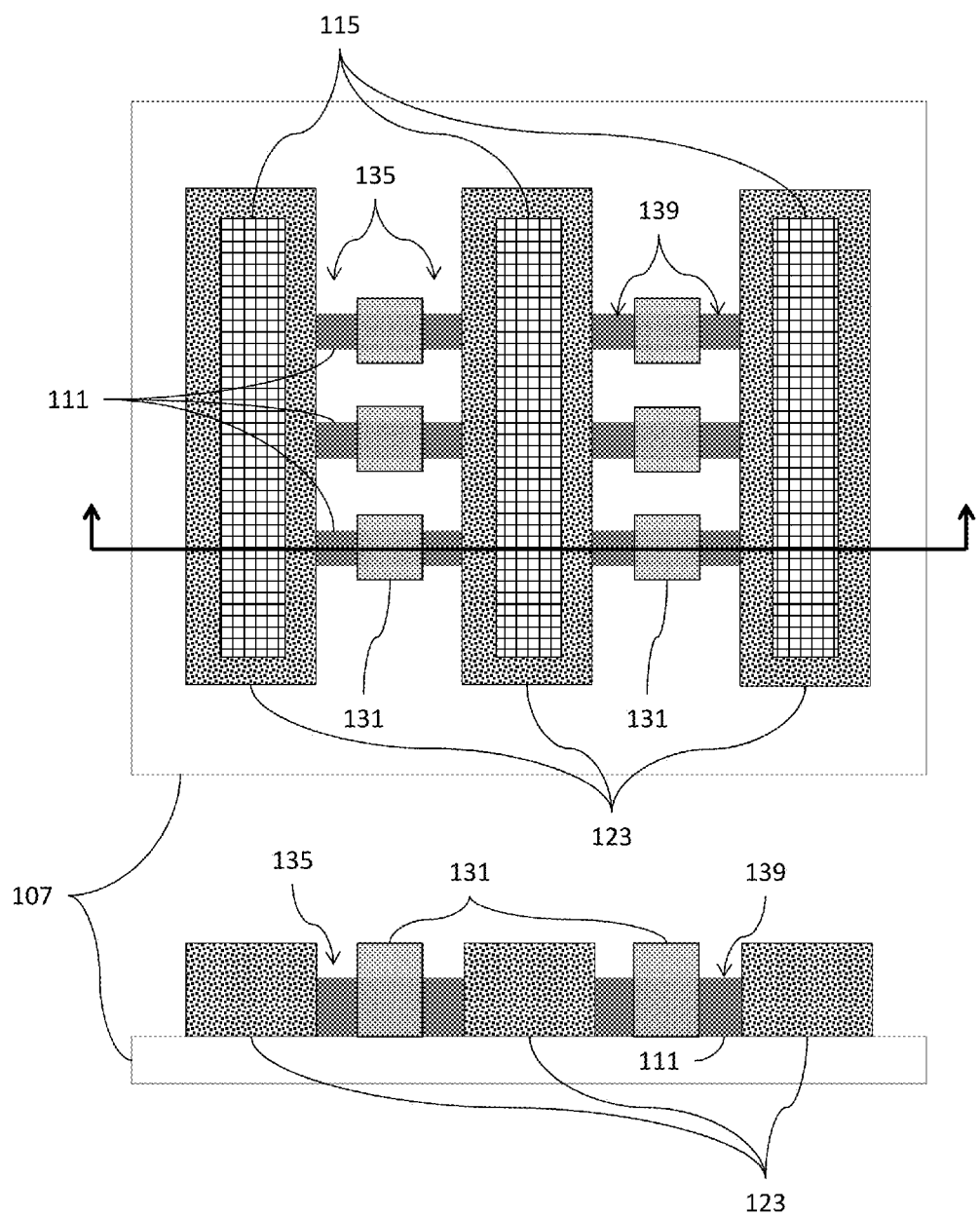
FIG. 4 is a schematic diagram of a semiconductor structure illustrating various aspects of devices and methods herein.

In FIG. 4, the size of the spacer 123 has been reduced and a gap 135 has been formed between the sections of silicon 131 and the spacer 123, exposing second exposed regions 139 of the parallel fins 111. The size of the spacer 123 can be reduced by any appropriate material removal process, such as wet etching and/or dry etching.

Figure 5:
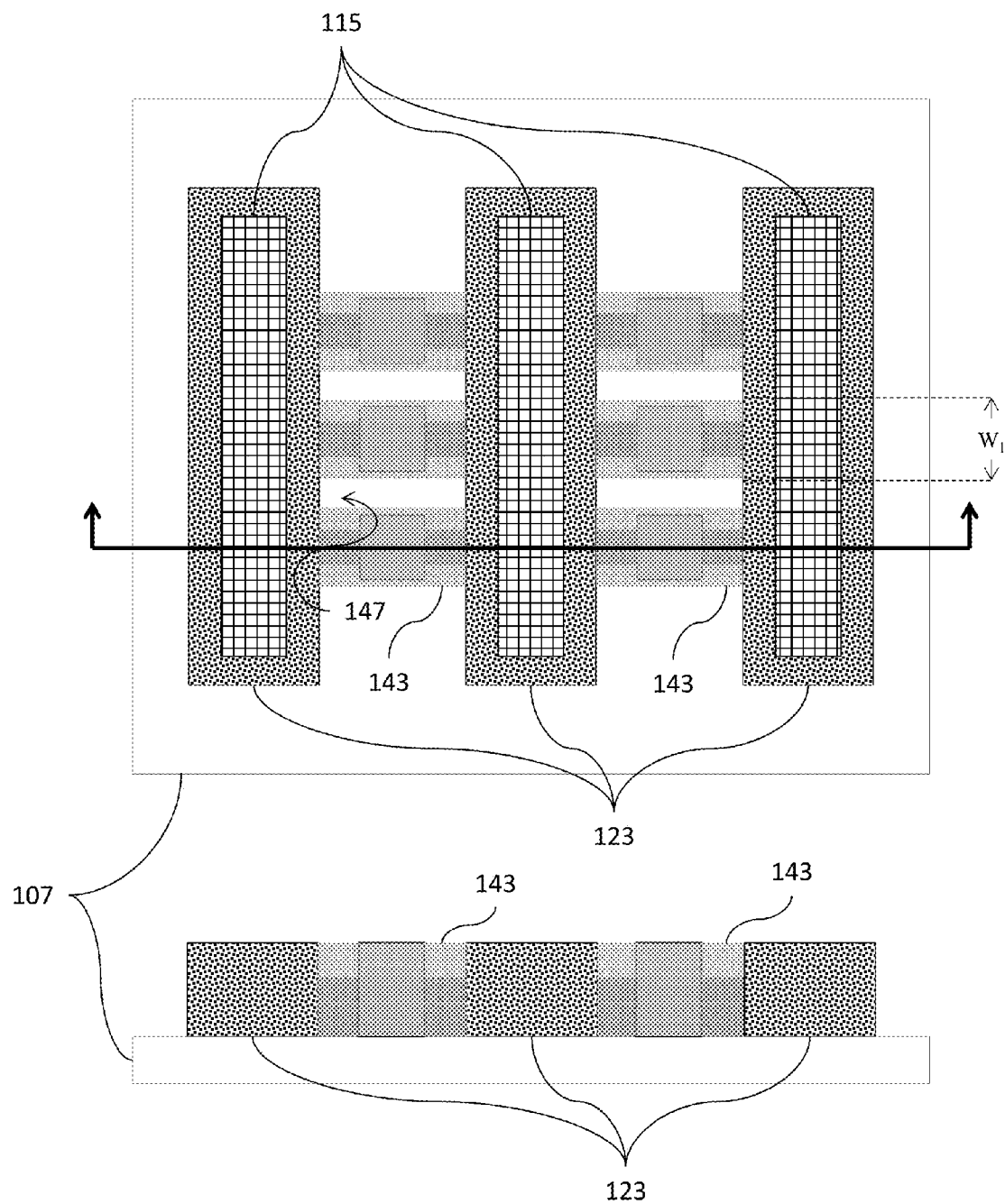
FIG. 5 is a schematic diagram of a semiconductor structure illustrating various aspects of devices and methods herein.

As shown in FIG. 5, a first set of expanded fin regions 143 is formed adjacent to the spacer 123 on at least a portion of the second exposed regions 139 and on at least a portion of the sections of silicon 131. The first set of expanded fin regions 143 may be formed using a first material, such as silicon-germanium (SiGe) or silicon (Si) for the source or drain portion of a pMOS device. According to devices and methods herein, the first set of expanded fin regions 143 may be selectively grown in the second exposed regions 139 using an epitaxial process. The first set of expanded fin regions 143 is formed to a first width $W_1$, such that a dielectric gap 147 remains between adjacent portions of the first set of expanded fin regions 143. Once formed, the first set of expanded fin regions 143 may be covered with a dielectric material.

Figure 6:
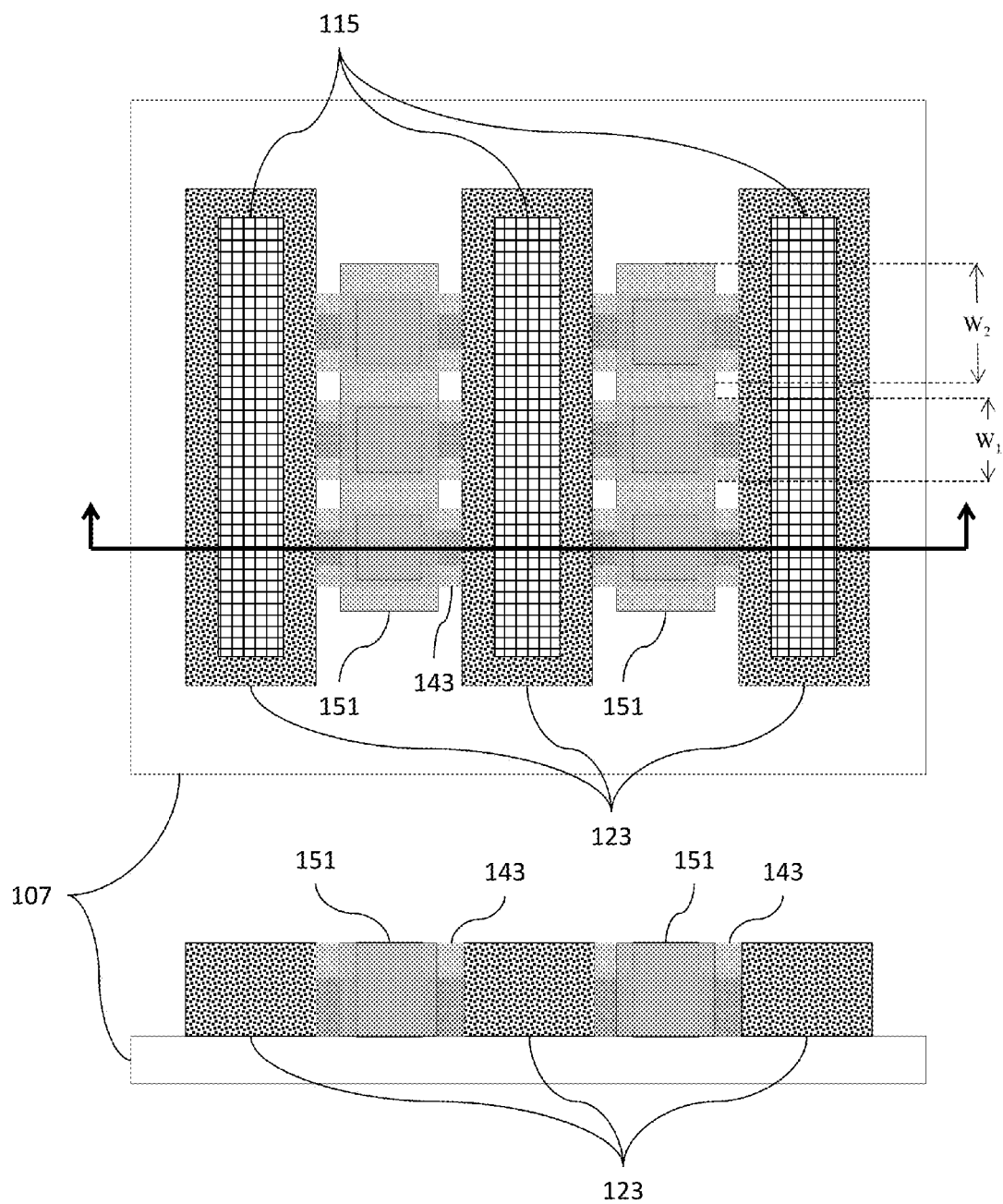
FIG. 6 is a schematic diagram of a semiconductor structure illustrating various aspects of devices and methods herein.

As shown in FIG. 6, a second set of expanded fin regions 151 is formed on at least a remaining portion of the second exposed regions 139 and the sections of silicon 131. The second set of expanded fin regions 151 may be formed using a second material, such as silicon compounds ($Si_xC_{(1-x)}$) or silicon (Si) for the source or drain portion of an nMOS device. According to devices and methods herein, the second set of expanded fin regions 151 may be selectively grown in the second exposed regions 139 using an epitaxial process. The second set of expanded fin regions 151 is formed to a second width $W_2$, such that the second set of expanded fin regions 151 merge between fins to form a continuous source or drain region. Note: the second material is different from the first material and the second width $W_2$ is larger than the first width $W_1$.

According to devices and methods herein, it is contemplated that the first set of expanded fin regions 143 and the second set of expanded fin regions 151 may be formed by selectively growing the first material or second material epitaxially on exposed regions of the fins. Further, it is contemplated that the first material and the second material have different impurity qualities. For example, the first material may comprise p-doped SiGe and the second material may comprise n-doped Si; alternatively, the first material may comprise p-doped Si and the second material may comprise n-doped $Si_xC_{(1-x)}$. Other appropriate material combinations may be used.

Figure 7:
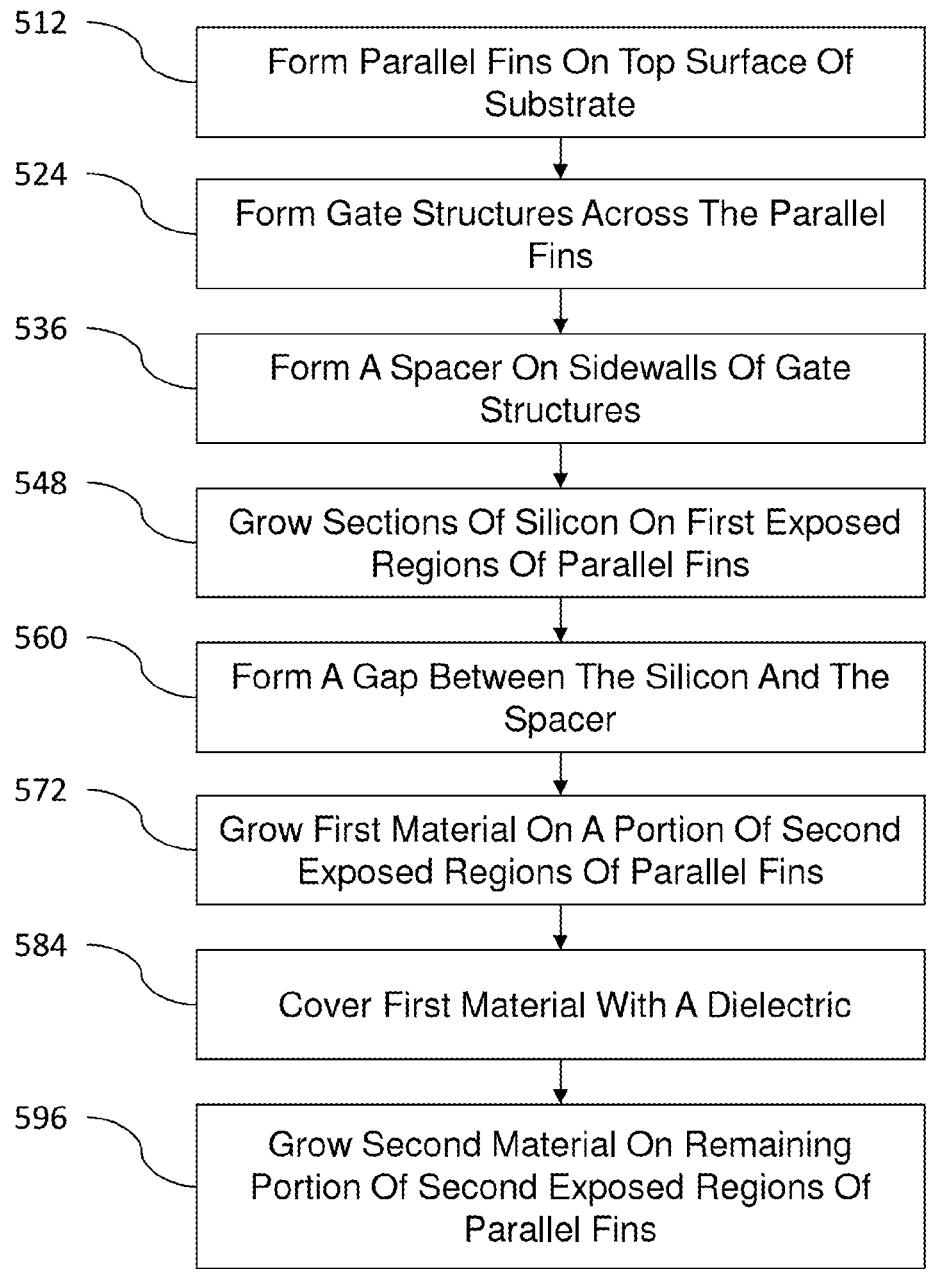
FIG. 7 is a flow diagram illustrating devices and methods herein.

FIG. 7 is a flow diagram illustrating the processing flow of an exemplary method of fabricating a field effect transistor (FET) according to devices and methods herein. At 512, parallel fins are formed on a top surface of a substrate. Gate structures are formed across the parallel fins, at 524. A spacer is formed on sidewalls of the gate structures, at 536. The spacer is made of an electrical insulator material deposited on the gate structures. At 548, sections of silicon are selectively grown on first exposed regions of the parallel fins. A gap is formed between the sections of silicon and the spacer, exposing second exposed regions of the parallel fins, at 560. Forming the gap between the sections of silicon and the spacer may comprise etching the spacer to a smaller dimension. At 572, a first material is selectively grown on a portion of the second exposed regions of the parallel fins and a portion of the sections of silicon. Growing the first material may comprise using an epitaxial process. The first material may be grown to a first width that is a greater width relative to other portions of the fins. At 584, the first material is covered with a dielectric material. At 596, a second material is selectively grown on a portion of remaining portions of the second exposed regions of the parallel fins and of the sections of silicon. Growing the second material may comprise using an epitaxial process. The second material may be grown to a second width that is greater than the first width. The second material is grown to be continuous between adjacent fins. According to devices and methods herein, the first material and the second material may be selected from silicon (Si), silicon-germanium (SiGe), and other silicon compounds ($Si_xC_{(1-x)}$). The first material and the second material have different impurity qualities.

It is contemplated that the methods described herein can be used in fabricating a complementary metal oxide semiconductor (CMOS) device.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

A complementary metal oxide semiconductor (CMOS) device according to devices and methods herein may include a plurality of parallel fins having channel regions and source and drain regions. A plurality of parallel gate conductors is over and intersecting the channel regions of the fins. Electrical insulator material surrounds the sides of the gate conductors. Each of the fins has a main fin body and wider regions extending from the main fin body between the electrical insulator material surrounding the sides of the gate conductors. The wider regions include a first wider region extending a first width from the main fin body. The first wider region is made of a first material. The wider regions further include a second wider region extending a second width from the main fin body. The second wider region has a first portion made of a second material and a second portion made of a third material. The second material and the third material have different impurity qualities. The material of the second wider region is continuous between adjacent fins.

Aspects of the present disclosure are described herein with reference to flowchart illustrations and/or block diagrams of methods, apparatus (systems), and computer program products according to various devices and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further devices and methods herein, an article of manufacture is provided that includes a tangible computer readable medium having computer readable instructions embodied therein for performing the steps of the computer implemented methods, including, but not limited to, the method illustrated in FIG. 5. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 5.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the devices and methods herein by software and/or firmware, a program constituting the software may be installed into a computer with dedicated hardware, from a storage medium or a network, and the computer is capable of performing various functions if with various programs installed therein.

Figure 8:
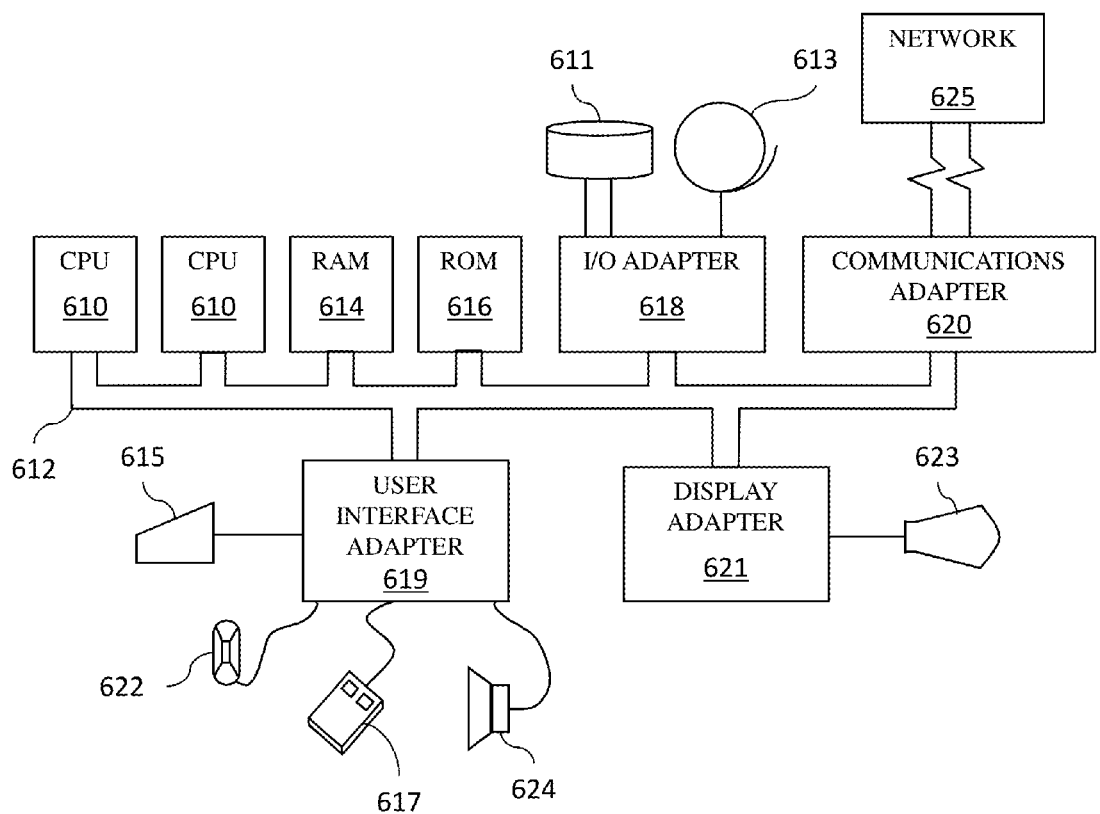
FIG. 8 is a schematic diagram of a hardware system according to devices and methods herein.

A representative hardware environment for practicing the devices and methods herein is depicted in FIG. 8. This schematic drawing illustrates a hardware configuration of an information handling/computer system in accordance with the devices and methods herein. The system comprises at least one processor or central processing unit (CPU) 610. The CPUs 610 are interconnected via system bus 612 to various devices such as a Random Access Memory (RAM) 614, Read-Only Memory (ROM) 616, and an Input/Output (I/O) adapter 618. The I/O adapter 618 can connect to peripheral devices, such as disk units 611 and tape drives 613, or other program storage devices that are readable by the system. The system can read the inventive instructions on the program storage devices and follow these instructions to execute the methodology of the devices and methods herein.

In FIG. 8, CPUs 610 perform various processing based on a program stored in a Read Only Memory (ROM) 616 or a program loaded from a peripheral device, such as disk units 611 and tape drives 613 to a Random Access Memory (RAM) 614. In the RAM 614, required data when the CPUs 610 perform the various processing or the like is also stored, as necessary. The CPUs 610, the ROM 616, and the RAM 614 are connected to one another via a bus 612. An I/O adapter 618 is also connected to the bus 612 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 614, as necessary.

The system further includes a user interface adapter 619 that connects a keyboard 615, mouse 617, speaker 624, microphone 622, and/or other user interface devices such as a touch screen device (not shown) to the bus 612 to gather user input. Additionally, a communication adapter 620 including a network interface card such as a LAN card, a modem, or the like connects the bus 612 to a data processing network 625. The communication adapter 620 performs communication processing via a network such as the Internet. A display adapter 621 connects the bus 612 to a display device 623, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 8, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 616, a hard disk contained in the storage section of the disk units 611, or the like, which has the program stored therein and is distributed to the user together with the device that contains them.

As will be appreciated by one skilled in the art, aspects of the devices and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 9:
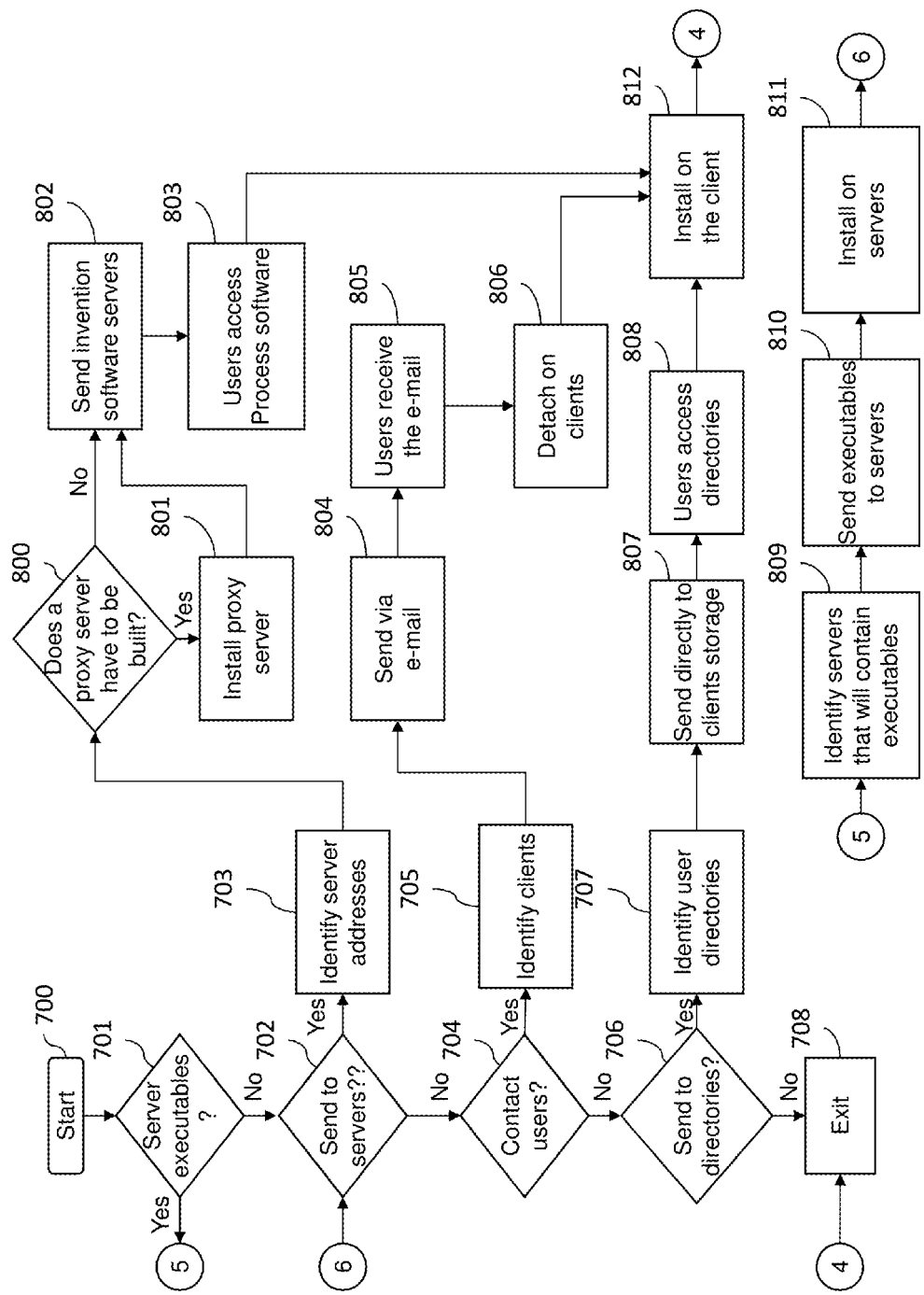
FIG. 9 is a schematic diagram of a deployment system according to devices and methods herein.

In FIG. 9, step 700 begins the deployment of the process software. The first thing is to determine if there are any programs that will reside on a server or servers when the process software is executed 701. If this is the case, then the servers that will contain the executables are identified 809. The process software for the server or servers is transferred directly to the servers' storage via FTP or some other protocol, or by copying through the use of a shared file system 810. The process software is then installed on the servers 811.

Next, a determination is made on whether the process software is to be deployed by having users access the process software on a server or servers 702. If the users are to access the process software on servers, then the server addresses that will store the process software are identified 703.

A determination is made if a proxy server is to be built 800 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 801. The process software is either sent to the servers via a protocol such as FTP or it is copied directly from the source files to the server files via file sharing 802. Another method would be to send a transaction to the servers that contain the process software and have the server process the transaction, then receive and copy the process software to the server's file system. Once the process software is stored at the servers, the users, via their client computers, then access the process software on the servers and copy it to their client computers' file systems 803. Another method is to have the servers automatically copy the process software to each client and then run the installation program for the process software at each client computer. The users execute the program that installs the process software on their client computer 812, and then exit the process 708.

In step 704, a determination is made whether the process software is to be deployed by sending the process software to users via e-mail. The set of users where the process software will be deployed are identified together with the addresses of the user client computers 705. The process software is sent via e-mail 804 to each of the users' client computers. The users receive the e-mail 805 and then detach the process software from the e-mail to a directory on their client computers 806. The users execute the program that installs the process software on their client computer 812, and then exit the process 708.

Lastly, a determination is made on whether the process software will be sent directly to user directories on their client computers 706. If so, the user directories are identified 707. The process software is transferred directly to the users' client computer directory 807. This can be done in several ways such as, but not limited to, sharing of the file system directories and then copying from the sender's file system to the recipient users' file system or alternatively using a transfer protocol such as File Transfer Protocol (FTP). The users access the directories on their client file systems in preparation for installing the process software 808. The users execute the program that installs the process software on their client computer 812, and then exit the process 708.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 10:
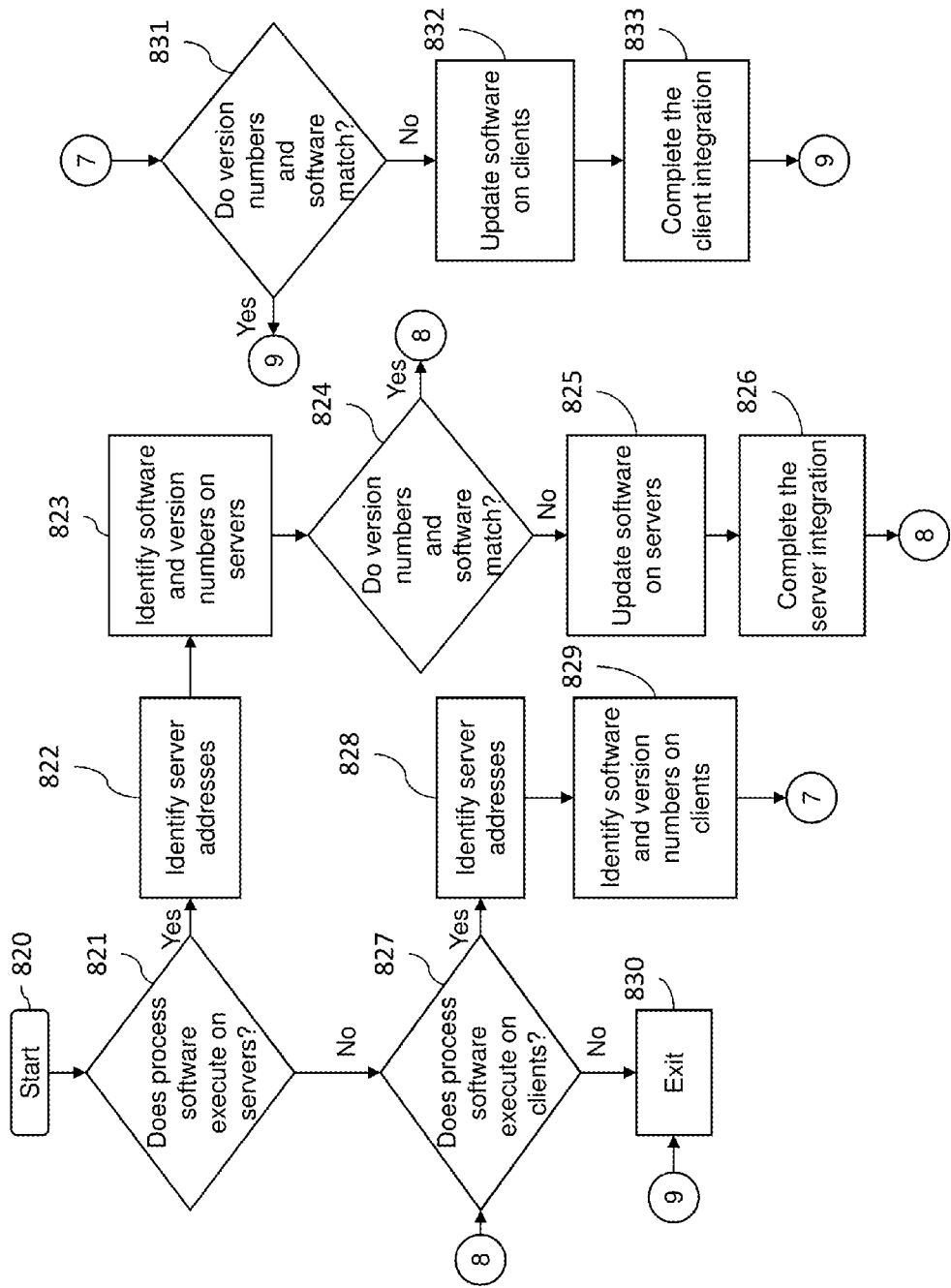
FIG. 10 is a schematic diagram of an integration system according to devices and methods herein.

In FIG. 10, step 820 begins the integration of the process software. The first thing is to determine if there are any process software programs that will execute on a server or servers 821. If this is not the case, then integration proceeds to 827. If this is the case, then the server addresses are identified 822. The servers are checked to see if they contain software that includes the operating system (OS), applications, and network operating systems (NOS), together with their version numbers that have been tested with the process software 823. The servers are also checked to determine if there is any missing software that is required by the process software 823.

A determination is made if the version numbers match the version numbers of OS, applications, and NOS that have been tested with the process software 824. If all of the versions match and there is no missing required software, the integration continues in 827.

If one or more of the version numbers do not match, then the unmatched versions are updated on the server or servers with the correct versions 825. Additionally, if there is missing required software, then it is updated on the server or servers 825. The server integration is completed by installing the process software 826.

Step 827, which follows either step 821, 824, or 826, determines if there are any programs of the process software that will execute on the clients. If no process software programs execute on the clients, the integration proceeds to 830 and exits. If this is not the case, then the client addresses are identified at 828.

The clients are checked to see if they contain software that includes the operating system (OS), applications, and network operating systems (NOS), together with their version numbers that have been tested with the process software 829. The clients are also checked to determine if there is any missing software that is required by the process software 829.

A determination is made as to whether the version numbers match the version numbers of OS, applications, and NOS that have been tested with the process software 831. If all of the versions match and there is no missing required software, then the integration proceeds to 830 and exits.

If one or more of the version numbers do not match, then the unmatched versions are updated on the clients with the correct versions 832. In addition, if there is missing required software then it is updated on the clients 832. Installing the process software on the clients 833 completes the client integration. The integration proceeds to 830 and exits.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload. The measurements of use that are used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider. In another method, the service provider requests payment directly from a customer account at a banking or financial institution. In another method, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization, and it is scalable, providing capacity On-Demand in a pay-as-you-go model.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another method, the service provider requests payment directly from a customer account at a banking or financial institution.

In another method, if the service provider is also a customer of the customer that uses the process software application, the payment owed to the service provider is reconciled to the payment owed by the service provider to minimize the transfer of payments.

Figure 11:
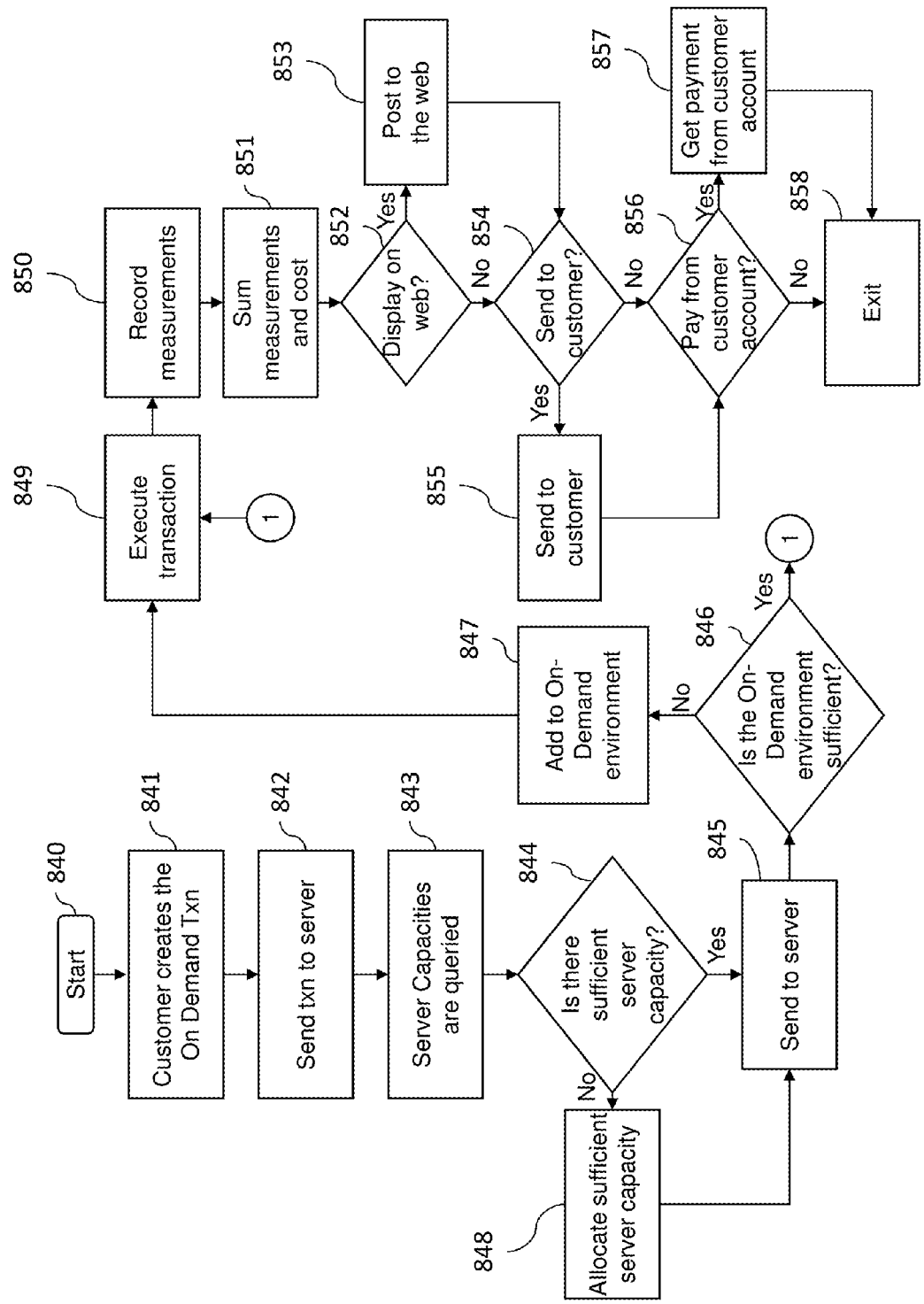
FIG. 11 is a schematic diagram of an On-Demand system according to devices and methods herein.

In FIG. 11, step 840 begins the On-Demand process. A transaction is created that contains the unique customer identification, the requested service type, and any service parameters that further specify the type of service 841. The transaction is then sent to the main server 842. In an On-Demand environment, the main server can initially be the only server, then, as capacity is consumed, other servers are added to the On-Demand environment.

The server central processing unit (CPU) capacities in the On-Demand environment are queried 843. The CPU requirement of the transaction is estimated, and then the servers' available CPU capacity in the On-Demand environment is compared to the transaction CPU requirement to see if there is sufficient CPU capacity available in any server to process the transaction 844. If there is not sufficient server CPU capacity available, then additional server CPU capacity is allocated to process the transaction 848. If there was already sufficient CPU capacity available, then the transaction is sent to a selected server 845.

Before executing the transaction, a check is made of the remaining On-Demand environment to determine if the environment has sufficient available capacity for processing the transaction. This environment capacity consists of such things as, but not limited to, network bandwidth, processor memory, storage etc. 846. If there is not sufficient available capacity, then capacity will be added to the On-Demand environment 847. Next, the required software to process the transaction is accessed, loaded into memory, and then the transaction is executed 849.

The usage measurements are recorded 850. The usage measurements consist of the portions of those functions in the On-Demand environment that are used to process the transaction. The usage of such functions as, but not limited to, network bandwidth, processor memory, storage, and CPU cycles are what are recorded. The usage measurements are summed, multiplied by unit costs, and then recorded as a charge to the requesting customer 851. If the customer has requested that the On-Demand costs be posted to a web site 852, then they are posted 853.

If the customer has requested that the On-Demand costs be sent via e-mail to a customer address 854, then they are sent 855. If the customer has requested that the On-Demand costs be paid directly from a customer account 856, then payment is received directly from the customer account 857. The last step is to exit the On-Demand process 858.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 12:
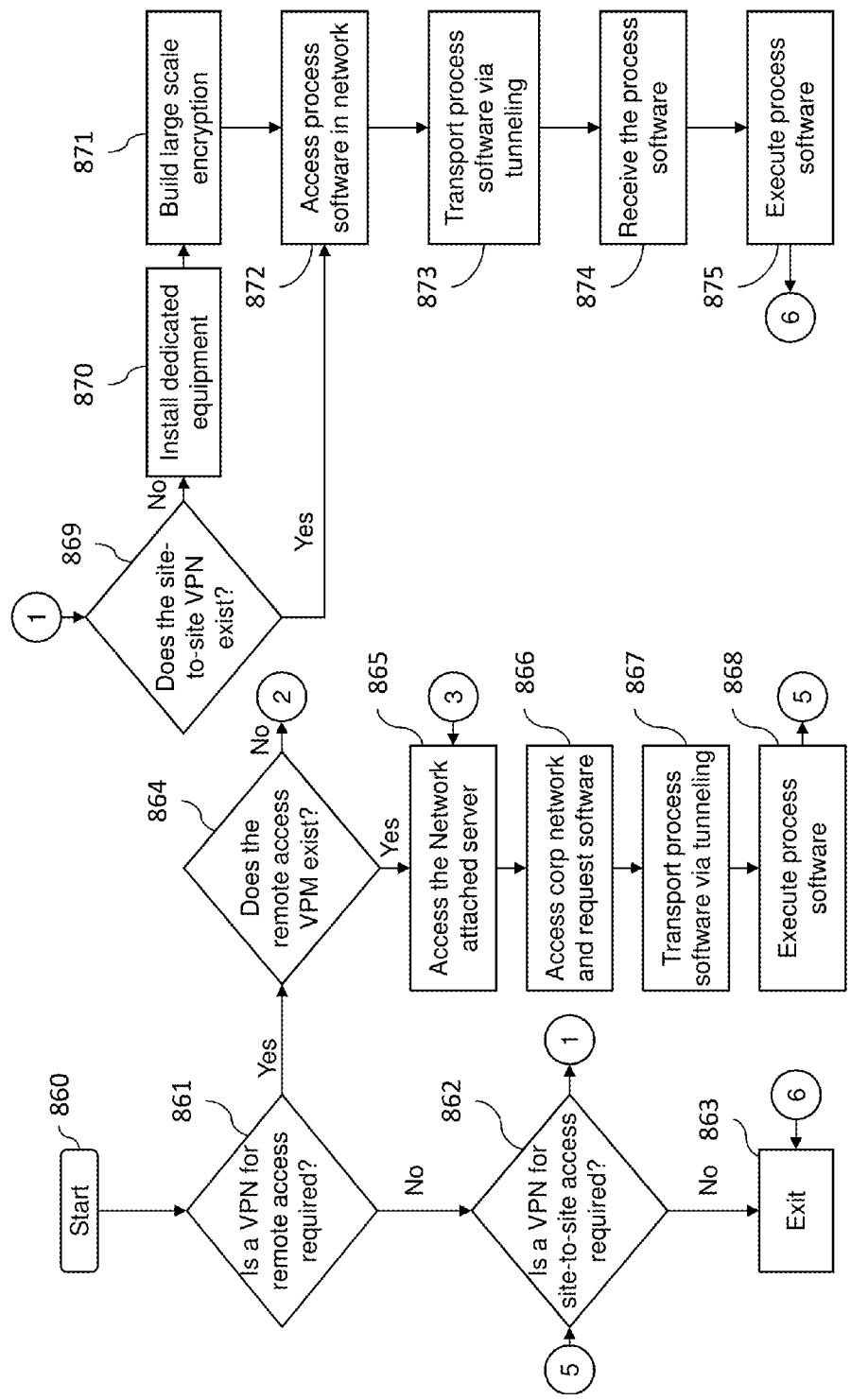
FIG. 12 is a schematic diagram of a virtual private network system according to devices and methods herein.
Figure 13:
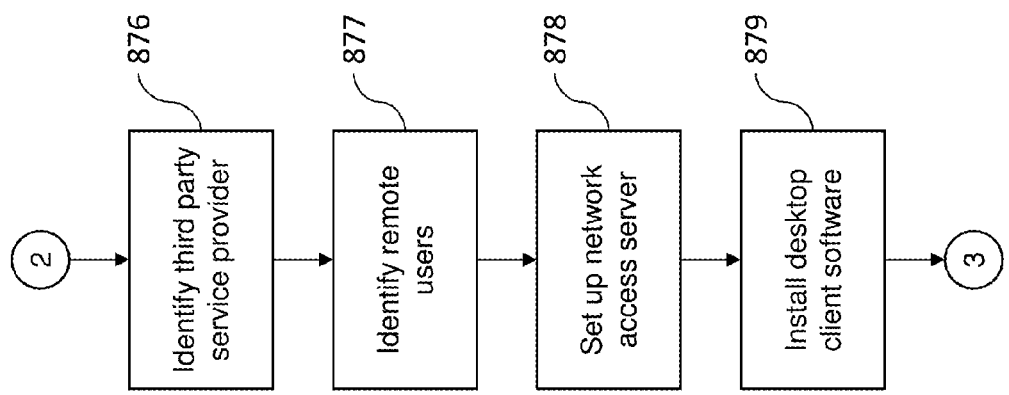
FIG. 13 is a schematic diagram of a virtual private network system according to devices and methods herein.

In FIGS. 12 and 13, step 860 begins the Virtual Private Network (VPN) process. A determination is made to see if a VPN for remote access is required 861. If it is not required, then proceed to 862. If it is required, then determine if the remote access VPN exists 864.

If it does exist, then proceed to 865. Otherwise, identify the third party provider that will provide the secure, encrypted connections between the company's private network and the company's remote users 876. The company's remote users are identified 877. The third party provider then sets up a network access server (NAS) 878 that allows the remote users to dial a toll-free number or attach directly via a cable or DSL modem to access, download, and install the desktop client software for the remote-access VPN 879.

After the remote access VPN has been built, or if it been previously installed, the remote users can then access the process software by dialing into the NAS or attaching directly via a cable or DSL modem into the NAS 865. This allows entry into the corporate network where the process software is accessed 866. The process software is transported to the remote users' desktop over the network via tunneling. That is, the process software is divided into packets and each packet, including the data and protocol, is placed within another packet 867. When the process software arrives at the remote users' desktop, it is removed from the packets, reconstituted, and executed on the remote users' desktop 868.

A determination is made to see if a VPN for site-to-site access is required 862. If it is not required, then proceed to exit the process 863. Otherwise, determine if the site-to-site VPN exists 869. If it does exist, then proceed to 872. Otherwise, install the dedicated equipment required to establish a site-to-site VPN 870. Then build the large-scale encryption into the VPN 871.

After the site-to-site VPN has been built, or if it had been previously established, the users access the process software via the VPN 872. The process software is transported to the site users over the network via tunneling 873. That is, the process software is divided into packets and each packet, including the data and protocol, is placed within another packet 874. When the process software arrives at the remote users' desktop, it is removed from the packets, reconstituted, and executed on the site users' desktop 875. Proceed to exit the process 863.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A structure comprising:
    parallel fins comprising channel regions and source and drain regions;
    parallel gate conductors over and intersecting said channel regions of said fins; and
    electrical insulator material surrounding sides of said gate conductors,
        each of said fins having a main fin body, said parallel gate conductors being adjacent to said main fin body,
        each of said fins further having expanded fin regions between each pair of adjacent gate conductors, extending from said main fin body and electrically isolated from said gate conductors by said electrical insulator material surrounding said sides of said gate conductors,
        said expanded fin regions between each said pair of adjacent gate conductors comprising:
            first expanded fin regions extending a first width from said main fin body; and
            a second expanded fin region positioned laterally between said first expanded fin regions and extending a second width from said main fin body, said second width being greater than said first width, and said second expanded fin region being physically connected to an adjacent second expanded fin region on an adjacent fin.

2. The structure according to claim 1, said first expanded fin regions comprising a first material, and said second expanded fin region comprising a second material, said first material and said second material having different impurity qualities.

3. The structure according to claim 2, said first material and said second material comprising one of:
 silicon (Si),
 silicon-germanium (SiGe), and
 silicon compounds ($Si_xC_{(1-x)}$).

4. The structure according to claim 2, further comprising: a dielectric material on said first material.

5. The structure according to claim 1, further comprising: a dielectric gap between said first expanded fin regions and nadjacent first expanded fin regions of said adjacent fin.

6. The structure according to claim 1, said second expanded fin region further comprising:
 a first portion comprising a second material and a second portion comprising a third material,
 said second material and said third material having different impurity qualities.

7. The structure of claim 1, said structure comprising a field effect transistor (FET).

8. A complementary metal oxide semiconductor (CMOS) device comprising:
 parallel fins comprising channel regions and source and drain regions;
 parallel gate conductors over and intersecting said channel regions of said fins; and
 electrical insulator material surrounding sides of said gate conductors,
  each of said fins having a main fin body, said parallel gate conductors being adjacent to said main fin body,
  each of said fins further having expanded fin regions between each pair of adjacent gate conductors, extending from said main fin body and electrically isolated from said gate conductors by said electrical insulator material surrounding said sides of said gate conductors,
  said expanded fin regions between each said pair of adjacent gate conductors comprising:
   first expanded fin regions extending a first width from said main fin body, said first expanded fin regions comprising a first material; and
   a second expanded fin region positioned laterally between said first expanded fin regions and extending a second width from said main fin body, said second width being greater than said first width,
   said second expanded fin region comprising a first portion comprising a second material and a second portion comprising a third material,
   said second material and said third material comprising silicon materials having different impurity qualities, and
   said second expanded fin region being physically connected to an adjacent second expanded fin region on an adjacent fin.

9. The CMOS device according to claim 8, further comprising: a dielectric material between said second material and said third material.

10. The CMOS device according to claim 8, said first material, said second material, and said third material comprising one of:
 silicon (Si),
 silicon-germanium (SiGe), and
 silicon compounds ($Si_xC_{(1-x)}$).

11. The CMOS device according to claim 8, further comprising: a dielectric gap between said first expanded fin regions and adjacent first expanded fin regions of said adjacent fin.

12. A structure comprising:
 parallel fins comprising channel regions and source and drain regions;
 parallel gate conductors over and intersecting said channel regions of said fins; and
 electrical insulator material surrounding sides of said gate conductors,
  each of said fins having a main fin body, said parallel gate conductors being adjacent to said main fin body,
  each of said fins further having expanded fin regions between each pair of adjacent gate conductors, extending from said main fin body and electrically isolated from said gate conductors by said electrical insulator material surrounding said sides of said gate conductors,
  said expanded fin regions between each said pair of adjacent gate conductors comprising:
   first expanded fin regions extending a first width from said main fin body; and
   a second expanded fin region positioned laterally between said first expanded fin regions and extending a second width from said main fin body, said second width being greater than said first width, and
   said first expanded fin regions being physically separated from adjacent first expanded fin regions on an adjacent fin, and
   said second expanded fin region being physically connected to an adjacent second expanded fin region on said adjacent fin.

13. The structure according to claim 12, said first expanded fin regions comprising a first material, and said second expanded fin region comprising a second material, said first material and said second material having different impurity qualities.

14. The structure according to claim 13, said first material and said second material comprising one of:
 silicon (Si),
 silicon-germanium (SiGe), and
 silicon compounds ($Si_xC_{(1-x)}$).

15. The structure according to claim 13, further comprising: a dielectric material on said first material.

16. The structure according to claim 12, further comprising: a dielectric gap between said first expanded fin regions and said adjacent first expanded fin regions.

17. The structure according to claim 12, said second expanded fin region further comprising:
 a first portion comprising a second material and a second portion comprising a third material,
 said second material and said third material having different impurity qualities.

18. The structure of claim 12, said structure comprising a field effect transistor (FET).

* * * * *